United States Patent [19]

Musumeci

[11] Patent Number: 4,721,684
[45] Date of Patent: Jan. 26, 1988

[54] METHOD FOR FORMING A BURIED LAYER AND A COLLECTOR REGION IN A MONOLITHIC SEMICONDUCTOR DEVICE

[75] Inventor: Salvatore Musumeci, Riposto, Italy

[73] Assignee: SGS Microelettronica SpA, Agrate Brianza, Italy

[21] Appl. No.: 811,754

[22] Filed: Dec. 20, 1985

[30] Foreign Application Priority Data

Dec. 20, 1984 [IT] Italy ................................ 6633 A/84

[51] Int. Cl.$^4$ ............................................. H01L 21/20
[52] U.S. Cl. ......................................... 437/30; 437/31; 437/51; 437/59; 437/151
[58] Field of Search .... 148/190, DIG. 167, DIG. 151

[56] References Cited

U.S. PATENT DOCUMENTS

| | | | |
|---|---|---|---|
| 3,249,831 | 5/1966 | New et al. | 148/190 |
| 3,576,475 | 4/1971 | Kronlage | 148/DIG. 151 |
| 3,802,968 | 4/1974 | Ghosh et al. | 148/190 |
| 3,812,519 | 5/1974 | Nakamura et al. | 148/190 |
| 4,132,573 | 1/1979 | Kraft | 148/190 |
| 4,239,558 | 12/1980 | Morishita et al. | 148/190 |
| 4,263,067 | 4/1981 | Takahashi et al. | 148/190 |

FOREIGN PATENT DOCUMENTS

| | | |
|---|---|---|
| 2408217 | 7/1979 | France . |
| 0128268 | 10/1979 | Japan ................................. 148/190 |

OTHER PUBLICATIONS

Vara, M. B. "A Self Isolation Scheme for Integrated Circuits", IBM J. Research and Development, vol. 15, No. 6, pp. 430–435, 11/29/71.
Ghandhi, S. K., "VLSI Fabrication Principles", 1983, p. 171.

Primary Examiner—Brian E. Hearn
Assistant Examiner—Kevin McAndrews
Attorney, Agent, or Firm—Wenderoth, Lind & Ponack

[57] ABSTRACT

A method for forming a buried layer below the collector region of a transistor of an integrated circuit uses a second doping agent (e.g.—small amounts of phosphorus) in addition to a main doping agent (e.g.—antimony). The use of the second doping agent solves the problem of undesired intermediate or phantom layers caused by the external diffusion (i.e.—out-diffusion) of the doping agent in a P-type doped isolation layer below the buried layer. The use of the second doping agent also solves the problem of providing a collector region for transistors of the integrated circuit with a concentration of impurities which is typically 10 times higher than that of the collector region of a power transistor integrated monolithically on the same chip. The use of the second doping agent finally makes it possible to achieve collector regions for the transistors of the integrated circuit with a concentration of impurities which differs from transistor to transistor in accordance with the circuit functions to be carried out.

4 Claims, 7 Drawing Figures

METHOD FOR FORMING A BURIED LAYER AND A COLLECTOR REGION IN A MONOLITHIC SEMICONDUCTOR DEVICE

BACKGROUND OF THE INVENTION

The invention relates to a method for the manufacture of electronic semiconductor devices and, in particular, devices comprising an integrated circuit and power components on the same chip of semiconductor material.

It is known that in order to reduce the collector series resistance of the transistors of an integrated circuit, a buried layer may be provided below the collector region of these transistors. If this buried layer is provided on a heavily doped layer, a phenomenon layer as "out-diffusion" takes place, and the doping agent in the doped layer below the buried layer is outwardly diffused from the original layer. The resultant buried layer then becomes thicker than required and its electrical characteristics are modified. In addition, the collector region lying above the buried layer is modified in that undesired intermediate or "phantom" layers may be formed therein, particularly in the portion of this layer closest to the buried layer. The conductivity of these layers is opposite to the conductivity which should exist in the buried layer and the collector region lying above it.

The phenomenon of out-diffusion is particularly problematic in the case of a monolithic structure in which the components of the integrated circuit are isolated from one another and from the remainder of the substrate by "isolation" regions of a conductivity opposite to that of the substrate.

As a result of the adverse effects of out-diffusion, considerable attempts have been made to prevent or, at least, reduce them. In a known method, the phenomenon of out-diffusion is reduced by lowering the temperature at which the operations are carried out. In a further known method, doping agent concentrations, times and temperatures are controlled within a very strict range of variation. However, this makes the processes involved in the manufacture of the device very critical and industrial manufacture is not economically viable.

In the above-mentioned monolithic structures, the problem of out-diffusion is accompanied by the problem of providing a collector region of a power transistor and collector regions of other transistors of the integrated circuit so as to have different concentrations of a doping agent. This requirement may also be the case for the transistors belonging to the integrated circuit when different electrical properties are required for these transistors.

For example, a higher doping level is required in the collector regions of the transistors of the integrated circuit designed to operate with a low collector-emitter voltage at saturation.

SUMMARY OF THE INVENTION

The main object of the present invention is to provide a method for the production of a buried layer in a monolithic semiconductor device which makes it possible to prevent the formation of harmful intermediate or phantom layers and which enables the achievement of optimum characteristics both for the power transistor and for the other transistors of the integrated circuit.

This and other objects are achieved in accordance with the present invention in the following way: the buried layer below the collector region of the integrated circuit is formed by means of pre-deposition, or implantation, and a subsequent diffusion of two doping agents of the same sign and having a diffusion coefficient D which is respectively higher and lower than a third doping agent of opposite sign deposited in advance or implanted and diffused in a silicon substrate.

BRIEF DESCRIPTION OF THE DRAWINGS

An embodiment of the invention is described below by way of non-limiting example with reference to the attached drawings in which.

Figure 3:
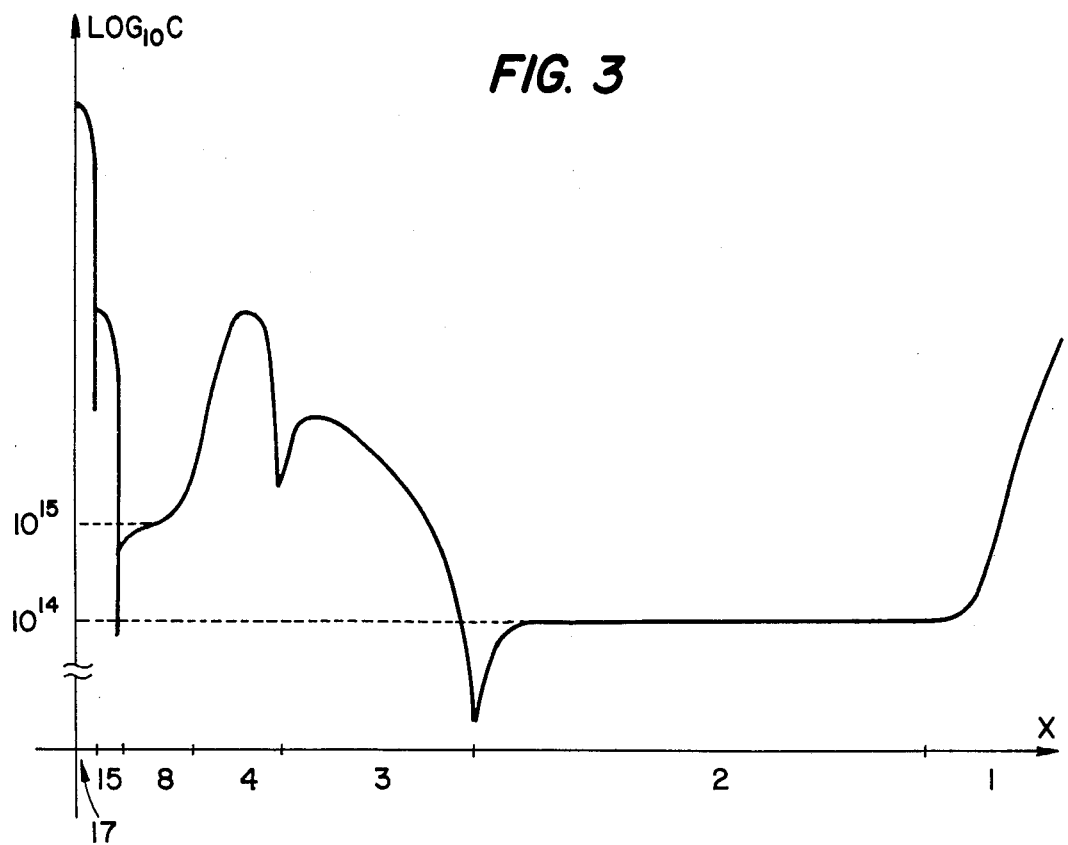

The curve of the graphs for the three types of doping agents used in accordance with the method of the invention is limited to the buried layer and the regions adjacent thereto;

FIG. 3 shows a graph representing the distribution, through the same section of the device as above, of the concentration of the doping agents of the invention as a function of depth x, where the figures on the x-axis relate to the regions as shown in FIGS. 1a to 1e.

DESCRIPTION OF THE PREFERRED EMBODIMENT

A method for the manufacture in accordance with the present invention of a semiconductor device constructed on a silicon chip and comprising a power transistor of the NPN type and two transistors of the NPN type of an integrated circuit formed on the same chip is described with reference to FIGS. 1a to 1e. The electrodes of the three transistors are disposed on the top of the chip, except for the collector of the power transistor which is situated on the bottom of the chip. The association on a same silicon chip of a power transistor and an integrated circuit comprising various transistors and other components connected together provides a very compact and efficient device, in which the integrated circuit is the lower-power control component and the power transistor is the high-power actuator which is capable of directly driving electric motors, solenoids, resistive loads and other power devices.

The method of the invention comprises the following successive steps:

Step A: A first epitaxial growth is carried out on an N+ doped monocrystalline silicon substrate 1 of low resistivity so as to form an N− doped layer 2 using phosphorus. The epitaxial layer 2 has a concentration of doping agent of approximately $1 \times 10^{14}$ atoms/cm$^3$ which is typical of a collector region of a high voltage transistor.

Step B: By means of known oxidation, photo-masking, etching and diffusion operations, a P-doped region 3 using boron at a concentration of $4 \times 10^{13}$ atoms/cm$^3$ is provided within the epitaxial layer 2 and precisely in an area of the chip designed for the integrated circuit.

This region 3 forms the horizontal isolation region of the transistors of the integrated circuit.

Step C: By means of the conventional operations of oxidation, photo-masking, etching and diffusion, the N+ doped buried layers 4 and 5 are then formed in the region 3. These layers which would be formed by the diffusion of antimony or arsenic in accordance with the prior art, are formed in accordance with the present invention by implanting a first dosage of antimony of $1 \times 10^{15}$ atoms/cm$^2$ and a second dosage of phosphorus of $1 \times 10^{13}$ atoms/cm$^2$, i.e. at a dosage which is 100 times lower than the dosage of antimony.

Figure 1A:
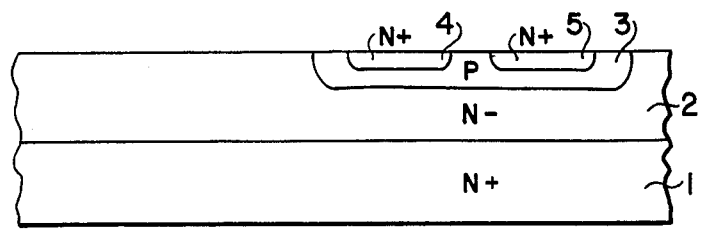
FIGS. 1a to 1e show sections, not to scale, of a portion of a monolithic device comprising a power transistor and two transistors of an integrated circuit during various stages of production in accordance with the present invention.
Figure 1B:
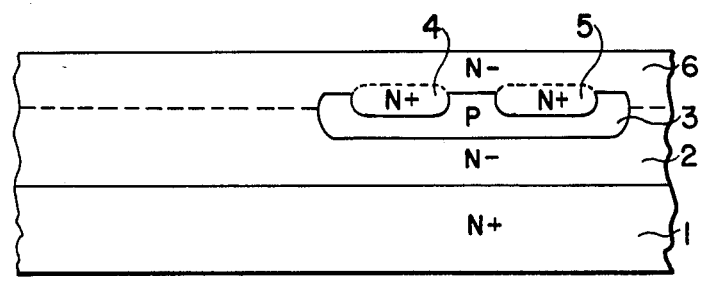

If it is desired, the phosphorus may be implanted first and then the antimony in the above-mentioned dosages (FIG. 1a).

Step D: A second epitaxial growth of N− doped silicon using phosphorus is then carried out so as to provide an epitaxial layer 6 having the same characteristics as the layer 2.

It must be noted that the two epitaxial layers, shown by 2 and 6 in FIGS. 1a to 1e and separated by a horizontal dashed line, in reality form, in the area reserved for the power transistor, a single layer which, together with the substrate 1, forms the collector region of the power transistor. It should also be noted that the buried layers 4 and 5 taken on the shape shown in FIG. 1b predominantly as a result of the epitaxial growth and also the subsequent high temperature operations to which the chip is subjected after the antimony and phosphorus implantations.

Figure 1C:
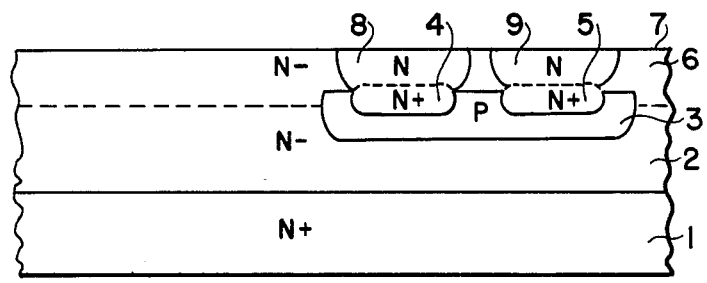

Step E: By means of the conventional techniques of oxidation, photo-masking, etching and diffusion, the low resistivity N-type regions 8 and 9 are then formed, these regions forming the collector regions of the transistors of the integrated circuit (FIG. 1c).

These regions are in particular formed by deposition, or implantation, of phosphorus on parts of the surface of the chip above the buried layers 4 and 5 and by the subsequent depth diffusion of the phosphorus. The time and the temperature of diffusion are selected such that the atoms of phosphorus deposited or implanted and those which diffuse from the buried layers tend to be distributed in such a way that the regions 8 and 9 have a quasi-constant concentration of approximately $1 \times 10^{15}$ atoms/cm$^3$ throughout their thickness.

It is worth noting, in order to highlight a feature of the present invention, that the regions 8 and 9 have a concentration of impurities which is 10 times higher than the concentration in the N-type epitaxial layers 2 and 6 forming the collector region of the power transistor. This is due to the diffusion of the phosphorus, together with the antimony, through the buried layers and to the further localized diffusion of the phosphorus below the surface 7 so as to make the doping uniform throughout the region. Consequently, in accordance with the present invention, the concentration of impurities in the epitaxially grown layer 6 is modified in the regions 8 and 9 thus producing collector regions for the transistors of the integrated circuit and the power transistor with different electrical characteristics and properties.

Step F: At this stage of the process, manufacture of the device continues by means of known operations which are described in outline for the sake of completeness.

Figure 1D:
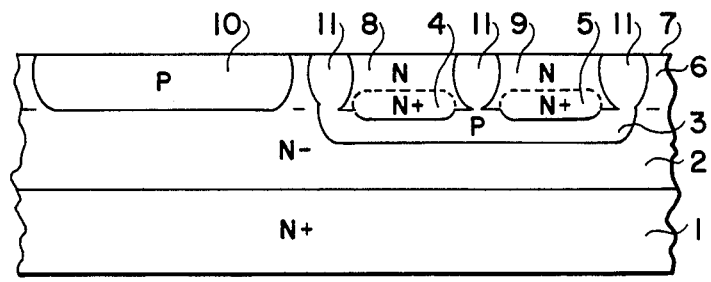

Using the conventional techniques of oxidation, photo-masking, etching and diffusion of boron, the P-type base region 10 of the power transistor and the lateral P-type isolation regions of the transistors of the integrated circuit are formed, as a result of which these transistors are isolated from one another and from the remainder of the chip (FIG. 1d).

Figure 1E:
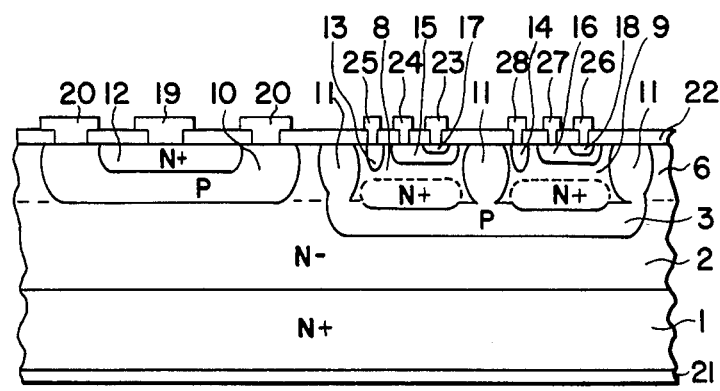

Step G: Using conventional techniques, an N+ emitter region 12 of the power transistor is formed as well as the N+ low resistivity regions 13 and 14, using the same coping agent; these regions are designed to provide the ohmic contact between the collector regions 8 and 9 of the integrated circuit transistors and a metal electrode (FIG. 1e).

Step H: This is followed by the formation of the diffused P-type base regions 15 and 16 and then the diffused N-type emitter regions 17 and 18 of the integrated circuit transistors (FIG. 1e).

Step I: Finally, the metal contacts for the emitter, base and collector electrodes 19, 20, and 21 of the power transistor and for the emitter electrodes 23 and 26, the base electrodes 24 and 27 and the collector electrodes 25 and 28 of the integrated circuit transistors are formed as well as the metal interconnection paths on the silicon oxide isolating layer 22 of the chip (FIG. 1e).

Figure 2:
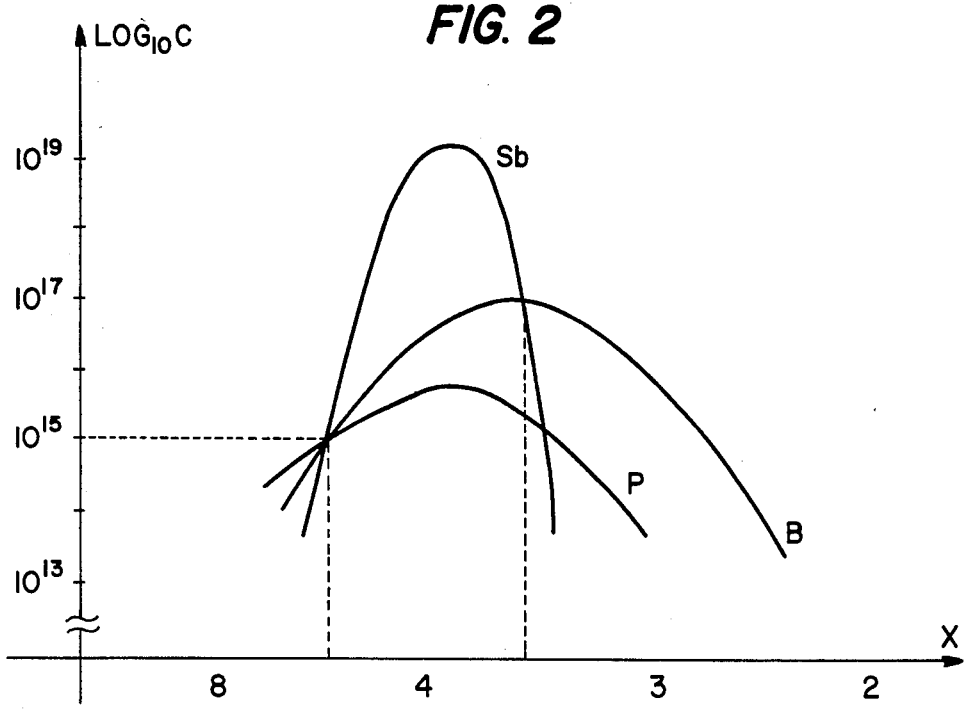
FIG. 2 shows graphs representing the distributions of the concentration of three types of doping agents in a section of the device of FIG. 1e passing through the buried layer and the upper collector, base and emitter regions of a transistor of the integrated circuit.

Reference is made to FIGS. 2 and 3 to illustrate the effects of the method of the present invention and to show how the objects of the invention are achieved using this method.

FIG. 2 shows three curves which represent the curves of the concentration of boron (B), antimony (Sb) and phosphorus (P) in the buried layer 4 and in the adjacent collector region 8 and isolation region 3 of the device obtained by the method described above. Boron (curve B) is the P-type impurity used in the diffusion designed to form the isolation region 3 of the transistors of the integrated circuit. Antimony (curve Sb) is the N-type impurity used in the implantation and subsequent diffusion for the formation of the buried layer 4 of the transistor of the integrated circuit. Phosphorus (curve P) is the N-type impurity used in small quantities in accordance with the present invention for the formation of the buried layer 4 of the integrated circuit in order to offset the harmful effect caused by the out-diffusion of the boron in the heavily doped region 3.

Since phosphorus has a diffusion coefficient D which is greater than that of both boron and antimony, there is more phosphorus than boron in the collector region 8 but not in the isolation region 3 of the integrated circuit transistors. In this way the collection region 8 contains three doping agents (boron, antimony, phosphorus) at almost equal concentrations (since they have been implanted in quantities such as to satisfy this condition) which provide this region with N doping, since two doping agents (antimony, phosphorus) are of the N-type and one doping agent (boron) is of the P-type. The subsequent epitaxial growth, and precisely the second epitaxial growth of the N-doped silicon layer using phosphorus with further localized phosphorus enrichment diffused in the region 8 which makes the concentrations of the doping agents almost constant in these regions, enables the achievement of the collector region 8 of the integrated circuit transistor with an average concentration of $1 \times 10^{15}$ atoms/cm$^3$ throughout its entire thickness, i.e. at a value which is ten times greater than the concentration in the epitaxial layer 2 forming the collector of the power transistor.

Moreover, as can be seen from FIG. 2, the addition of phosphorus, used in accordance with the present invention for the formation of the buried layers, does not cause any damage with respect to the uniform and known operation of the underlying isolation region 3. This is the case both because negligible quantities of phosphorus are used and particularly because any traces of phosphorus are confined within the buried layers close to the lower surface of these layers without diffusing into the P-type isolation layer 3, with the result that phantom layers are not produced in this layer.

FIg. 3 shows the profile of the impurities as a function of their depth in a vertical section through the device of FIG. 1e passing through the buried layer 4 and the emitter region 17 of a transistor of the integrated circuit. the reference numerals along the abscissa axis are identical to the numerals shown in FIG. 1e and relate to the layers forming the device described above.

In conclusion, known design and manufacturing criteria and the steps of the present invention described above provide a method for the manufacture of a semiconductor device which does not have the drawbacks of the prior art and therefore enables the achievement of a monolithic device with optimum characteristics and properties.

Although a single embodiment of the invention has been described and illustrated, it is obvious that many variants and modifications may be made thereto without departing from the scope of the invention.

For example, the invention may be used for the formation of integrated circuits for the purposes of obtaining transistor collector regions with concentrations of impurities which are not identical but differ. This is of great use if transistors integrated on the same chip and having different electrical characteristics as a result of the circuit functions which they have to carry out are required, for example signal transistors and switching transistors.

With reference to FIGS. 1a to 1e and, for the construction of collector regions 8 and 9 with their respective buried layers 4 and 5 of the integrated circuit transistors with different resistivity, modifications have to be made to step C (implantation of the coping agents in the buried layers 4 and 5) and step E (further diffusion of phosphorus for the enrichment of the collector regions 8 and 9) described above with respect to to the specific case in which identical collector regions are provided for the integrated circuit transistors. These modifications entail the addition of further oxidation, photo-masking, etching, implantation and diffusion of concentrations of phosphorus required by design criteria and known to persons skilled in the art and the repetition of these operations for each collector region of different resistivity required for the optimum operation of the integrated circuit.

In the particular case of two collector regions 8 and 9 with different concentrations of impurities, for example, a lower concentration in the region 8 and a high concentration in the region 9, the following steps are required:

Step C1: Formation of the buried layer 4.

Step C2: Formation of the buried layer 5 having a higher concentration of impurities by masking of the previous buried layer 4.

Step D: Growth of the N− doped epitaxial layer 6 using phosphorus.

Step E1: Formation of the region 8.

Step E2: Formation of the region 9 having a higher concentration of impurities by masking the previously formed region 8.

I claim:

1. A method for the manufacture of a semiconductor device comprising at least one power transistor and a control circuit integrated on a same chip of semiconductor material comprising the following steps:
   preparing a first layer of monocrystalline silicon of a first type of conductivity;
   forming, by doping of the first layer with a first doping agent, of a first region of a second type of conductivity which is opposite to the first type of conductivity;
   forming at least a second region in the first region by doping with impurities of the first type of conductivity;
   forming, by epitaxial growth, of a second layer of the first type of conductivity and having a high resistivity, the second layer completely covering the first layer and the first region;
   forming at least one isolation region of the second type of conductivity which passes through the second layer until it reaches the first region and includes within itself at least one portion of the second layer lying above one of the second regions;
   forming at least one region of the second type of conductivity in the second layer, this at least one region forming a base of a power trnsistor;
   forming a region of the first type of conductivity in the base region, this region forming an emitter of the power transistor;
   forming, within the portions of the second layer confined by the isolation regions, of additional regions forming active and passive components of the integrated circuit;
   forming electrodes on surfaces of the chip and metal interconnection paths between the active and passive components of the integrated circuit and the power transistor;
   wherein the formation of the second region includes the pre-deposition or implantation and the subsequent diffusion of a second and a third doping agent of the same type of conductivity and having diffusion coefficients which are respectively higher and lower than the coefficient of the first doping agent;
   wherein in at least one of the portions of the second layer bounded by an isolation region lying above one of the second regions, atoms of phosphorus are deposited or implanted and then caused to diffuse such that the concentration of all of the doping agents in the portion forming the collector region of a transistor of the integrated circuit is substantially constant and higher in value than the concentration of the single doping agent in the first layer and in the second layer of high resistivity forming the collector region of the power transistor.

2. A method for the manufacture of a semiconductor device comprising at least one power transistor and a control circuit integrated on a same chip of semiconductor material comprising the following steps:
   preparing a first layer of monocrystalline silicon of a first type of conductivity;
   forming, by doping of the first layer with a first doping agent, of a first region of a second type of conductivity which is opposite to the first type of conductivity;
   forming at least a second region in the first region by doping with impurities of the first type of conductivity;
   forming, by epitaxial growth, of a second layer of the first type of conductivity and having a high resistivity, the second layer completely covering the first layer and the first region;

forming at least one isolation region of the second type of conductivity which passes through the second layer until it reaches the first region and includes within itself at least one portion of the second layer lying above one of the second regions;

forming at least one region of the second type of conductivity in the second layer, this at least one region forming a base of a power transistor;

forming a region of the first type of conductivity in the base region, this region forming an emitter of the power transistor;

forming within the portions of the second layer confined by the isolation regions, of additional regions forming active and passive components of the integrated circuit;

forming electrodes on surfaces of the chip and metal interconnection paths between the active and passive components of the integrated circuit and the power transistor;

wherein the formation of the second region includes the pre-deposition or implantation and the subsequent diffusion of a second and a third doping agent of the same type of conductivity and having diffusion coefficients which are respectively higher and lower than the coefficient of the first doping agent;

wherein the second and third doping agents comprise antimony and phosphorus at a proportion of one to ten parts of phosphorus per hundred parts of antimony, and wherein the first doping agent comprises boron;

wherein in at least one of the portions of the second layer bounded by an isolation region lying above one of the second regions, atoms of phosphorus are deposited or implanted and then caused to diffuse such that the concentration of all of the doping agents in the portion forming the collector region of a transistor of the integrated circuit is substantially constant and higher in value than the concentration of the single doping agent in the first layer and in the second layer of high resistivity forming the collector region of the power transistor.

3. A method for the manufacture of a semiconductor device comprising at least one power transistor and a control circuit integrated on a same chip of semiconductor material comprising the following steps:

preparing a first layer of monocrystalline silicon of a first type of conductivity;

forming, by doping of the first layer with a first doping agent, of a first region of a second type of conductivity which is opposite to the first type of conductivity;

forming at least a second region in the first region by doping with impurities of the first type of conductivity;

forming, by epitaxial growth, of a second layer of the first type of conductivity and having a high resistivity, the second layer completely covering the first layer and the first region;

forming at least one isolation region of the second type of conductivity which passes through the second layer until it reaches the first region and includes within itself at least one portion of the second layer lying above one of the second regions;

forming at least one region of the second type of conductivity in the second layer, this at least one region forming a base of a power transistor;

forming a region of the first type of conductivity in the base region, this region forming an emitter of the power transistor;

forming, within the portions of the second layer confined by the isolation regions, of additional regions forming active and passive components of the integrated circuit;

forming electrodes on surfaces of the chip and metal interconnection paths between the active and passive components of the integrated circuit and the power transistor;

wherein the formation of the second region includes the pre-deposition or implantation and the subsequent diffusion of a second and a third doping agent of the same type of conductivity and having diffusion coefficients which are respectively higher and lower than the coefficient of the first doping agent;

wherein in at least one of the portions of the second layer bounded by an isolation region lying above one of the second regions, atoms of phosphorus are deposited or implanted and then caused to diffuse such that the concentration of all of the doping agents in the portion forming the collector region of a transistor of the integrated circuit is substantially constant and higher in value than the concentration of the single doping agent in the first layer and in the second layer of high resistivity forming the collector region of the power transistor;

wherein the ratio between the concentrations of impurities in the collector region of high resistivity of the power transistor and in each collector region of the transistors of the integrated circuit have a value of between 0.01 and 1.0.

4. A method as claimed in claim 2, wherein the ratio between the concentrations of impurities in the collector region of high resistivity of the power transistor and in each collector region of the transistors of the integrated circuit have a value of between 0.01 and 1.0.

* * * * *